(12) United States Patent
Tabata et al.

(10) Patent No.: US 7,128,477 B2
(45) Date of Patent: Oct. 31, 2006

(54) OPTICAL TRANSMITTER AND RECEIVER MODULE

(75) Inventors: Seiichiro Tabata, Tokyo (JP); Atsushi Kawamura, Tokyo (JP); Hironori Sasaki, Tokyo (JP)

(73) Assignees: Renesas Technology Corp., Tokyo (JP); Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/106,501

(22) Filed: Apr. 15, 2005

(65) Prior Publication Data

US 2006/0051033 A1 Mar. 9, 2006

(30) Foreign Application Priority Data

Sep. 6, 2004 (JP) .................... P 2004-258667

(51) Int. Cl.
G02B 6/36 (2006.01)
(52) U.S. Cl. .......................... 385/93; 385/37
(58) Field of Classification Search ............ 385/93, 385/37
See application file for complete search history.

(56) References Cited

U.S. PATENT DOCUMENTS

| | | | | |
|---|---|---|---|---|
| 4,834,485 A | * | 5/1989 | Lee | 398/138 |
| 5,555,334 A | * | 9/1996 | Ohnishi et al. | 385/93 |
| 5,611,006 A | * | 3/1997 | Tabuchi | 385/14 |
| 5,848,211 A | * | 12/1998 | Yang et al. | 385/93 |
| 6,939,058 B1 | * | 9/2005 | Gurevich et al. | 385/93 |
| 6,954,592 B1 | * | 10/2005 | Tan et al. | 398/138 |
| 2004/0071413 A1 | * | 4/2004 | Tsumori | 385/93 |
| 2004/0184744 A1 | * | 9/2004 | Uekawa | 385/93 |
| 2005/0175295 A1 | * | 8/2005 | Ozeki et al. | 385/89 |

FOREIGN PATENT DOCUMENTS

| | | |
|---|---|---|
| JP | 07-261054 | 10/1995 |
| JP | 08-015582 | 1/1996 |

* cited by examiner

*Primary Examiner*—John D. Lee
*Assistant Examiner*—Rhonda S. Peace
(74) *Attorney, Agent, or Firm*—McDermott Will & Emery LLP

(57) ABSTRACT

An optical transmitter and receiver module which can enhance a coupling comprises a light source emitting the first light, a light-receiving section receiving the second light, a diffraction device changing the direction of travel of at least one of the first light and the second light, a first lens which condenses the first light, outgoing from the light source and entering through the medium of the diffraction device, onto a light input/output face of the optical fiber and condenses the second light outgoing from the optical fiber onto the light-receiving section through the medium of the diffraction device, and a second lens which inhibits a beam of the first light outgoing from the light source from diverging and allows it to enter the first lens through the medium of the diffraction device.

12 Claims, 7 Drawing Sheets

OPTICAL TRANSMITTER AND RECEIVER MODULE

BACKGROUND OF THE INVENTION

1. Field of the Invention

The present invention mainly relates to an optical transmitter and receiver module used for optical communication.

2. Description of the Background Art

In terminal equipment of an optical access line, referred to as FTTH (Fiber To The Home), used in households, there are used optical transmitter and receiver modules which conduct bi-directional transmission with a single fiber. As an example of a conventional optical transmitter and receiver module, for example in FIG. 1 in Japanese Unexamined Patent Publications No. 7-261054, there is shown an example (a first conventional example) in which a module accommodating a laser diode and a photodiode in the same package is used.

In the example shown in the above Japanese Unexamined Patent Publications No. 7-261054, a lens is located between an aperture of the package in which a laser diode and a photodiode are accommodated and an optical fiber and a cover glass of the aperture of the package is provided with a diffraction grating. In the optical transmitter and receiver module thus constructed, disclosed in the above Japanese Unexamined Patent Publications No. 7-261054, light has outgone from a laser diode passes through the diffraction grating and is condensed into the optical fiber by the lens. On the other hand, in reception, light has outgone from the optical fiber reaches the diffraction grating through the lens. This light is then diffracted at the diffraction grating and condensed at a photodetecting surface of the photodiode.

And, in Japanese Unexamined Patent Publications No. 8-15582, there is disclosed a conventional example (a second conventional example), differing from the first conventional example, in which a lens is located in the immediate vicinity of a laser diode to make light from the laser diode a parallel rays of light and a diffraction grating having a lens function allows this parallel rays to enter an optical fiber.

However, in the first conventional example, there is a limit to that the laser diode and the photodiode are located close to each other when considering the sizes of these devices themselves, and it is difficult to cause them to approach each other within a distance of about 0.2 mm. For the purpose of allowing a laser light to enter an optical fiber and allowing light outgoing from the optical fiber to enter a photodiode by retaining a required space between the laser diode and the photodiode, there are a method of increasing a diffraction angle of a diffraction grating (a first method) and a method of lengthening a distance between a diffraction grating and a laser diode (a second method). However, in the first method, the diffraction grating, in which the diffraction angle is increased, decreases in a diffraction efficiency and causes a problem that a coupling efficiency of a laser light for an optical fiber is deteriorated or a photo-electrical conversion efficiency of light outgoing from an optical fiber in a photodiode is deteriorated. And, when a distance between a lens and a laser diode is lengthened like the second method, aberration becomes large and a problem that a coupling efficiency of a laser light for an optical fiber is deteriorated arises.

Further, in the second conventional example, there is a problem that since a diffraction grating has a lens function, it becomes a diffraction grating in the form of a circle band having a short period and therefore a diffraction efficiency is deteriorated.

SUMMARY OF THE INVENTION

It is an object of the present invention to provide an optical transmitter and receiver module which can enhance a coupling efficiency between a laser diode and an optical fiber, and can enhance a photo-electrical conversion efficiency of light outgoing from an optical fiber into a photodiode.

In order to attain the above object, an optical transmitter and receiver module of the present invention is an optical transmitter and receiver module which is connected to an optical fiber and transmits a first light and receives a second light via the optical fiber, and this module comprises a light source emitting the above-mentioned first light, a light-receiving section receiving the above-mentioned second light, a diffraction device changing the direction of travel of at least one of the above-mentioned first light and the above-mentioned second light, a first lens which condenses the above-mentioned first light, outgoing from the above-mentioned light source and entering through the medium of the above-mentioned diffraction device, onto a light input/output face of the above-mentioned optical fiber and condenses the above-mentioned second light outgoing from the above-mentioned optical fiber onto the above-mentioned light-receiving section through the medium of the above-mentioned diffraction device, and a second lens which inhibits a beam of the above-mentioned first light outgoing from the above-mentioned light source from diverging and allows it to enter the above-mentioned first lens through the medium of the above-mentioned diffraction device.

The optical transmitter and receiver module of the present invention thus constructed can enhance a coupling efficiency between a light source and an optical fiber, and can enhance a photo-electrical conversion efficiency of light outgoing from an optical fiber in a light-receiving section.

DETAILED DESCRIPTION OF THE PREFERRED EMBODIMENTS

Hereinafter, an optical transmitter and receiver module of Embodiment 1 in accordance with the present invention will be described taken in conjunction with drawings.

Embodiment 1

Figure 1:
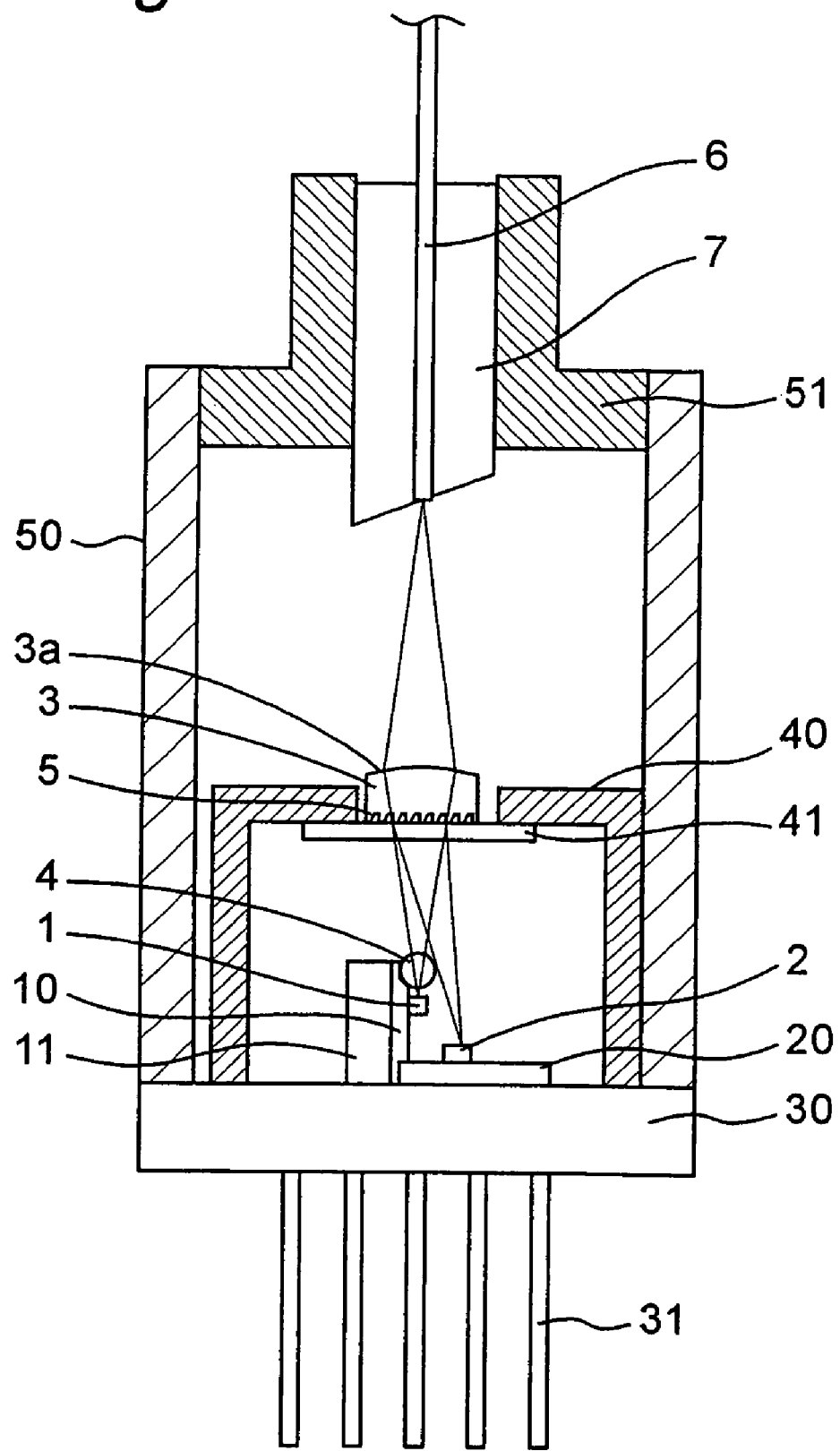
FIG. 1 is a sectional view showing a constitution of an optical transmitter and receiver module of Embodiment 1 in accordance with the present invention.

An optical transmitter and receiver module of this Embodiment 1 is similar to the conventional examples in that a laser light outgoing from a laser diode 1 enters an optical fiber 6 through a first lens 3 and a diffraction grating 5 and light outgoing from an optical fiber 6 enters a photodiode 2 through a diffraction grating 5 and a first lens 3 but it is different from the conventional examples in that a second lens is provided close to a laser diode 1 (FIG. 1 and the like).

Hereinafter, a constitution of the optical transmitter and receiver module of this Embodiment 1 will be described in detail.

Figure 2:
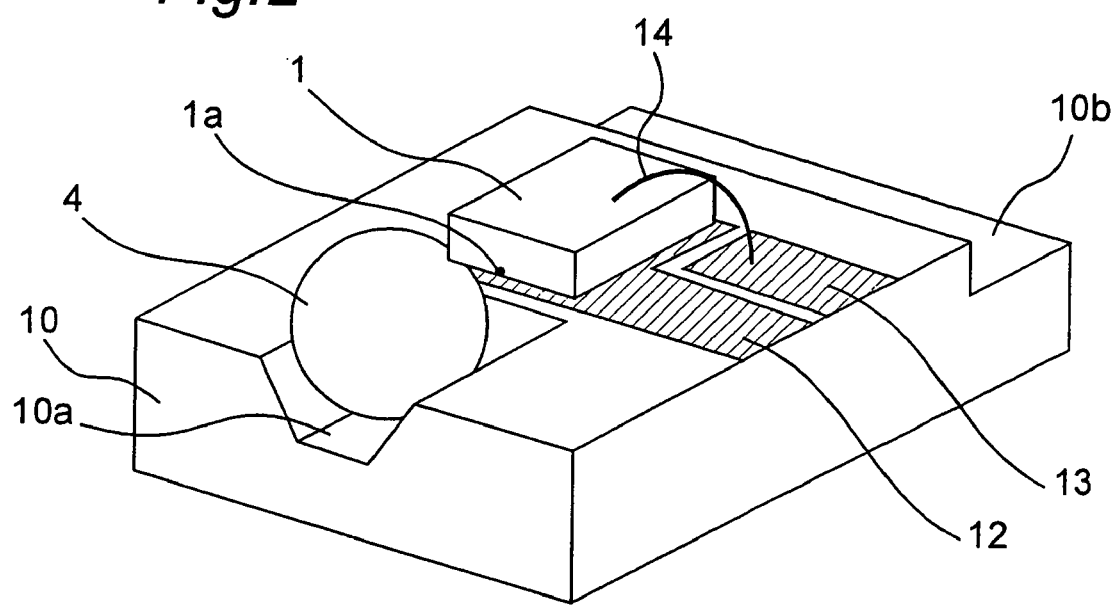
FIG. 2 is a perspective view of a Si surface-mounting substrate on which a laser diode and a ball lens 4 are mounted.

In this Embodiment 1, the laser diode 1 and a ball lens 4 as a second lens are surface mounted on a Si surface mounting substrate 10 and the Si surface-mounting substrate 10 is mounted on a stem 30 through the medium of a LD submount 11 (FIG. 2).

Specifically, as shown in FIG. 2, electrode patterns 12, 13 connected to the laser diode 1 are formed on an upper surface of the Si surface-mounting substrate 10, and for example, the laser diode 1 is bonded onto one electrode pattern 12 by die bonding using solder for continuity with the one electrode. A wire 14 is connected between the other electrode pattern 13 and the other electrode of the laser diode 1. In addition, the laser diode 1 is surface mounted in the form of junction down in such a way that a light-emitting point is positioned on the surface side of the Si surface-mounting substrate. A modulated current from a driving circuit (not shown) is applied to the laser diode 1 thus surface mounted through electrode patterns 12, 13 and a laser light is emitted through a ball lens 4 with a small diameter.

As shown in FIG. 2, a groove 10a is formed on the front side of the light-emitting point of the laser diode 1 on the upper surface of the Si surface-mounting substrate 10, for example, by etching and a ball lens 4 consisting of a transparent sphere is provided in the groove 10a so as to align the center of the lens with an axis of the laser beam from the laser diode 1. This ball lens 4 is fixed in the groove 10a with solder or an adhesive.

When the groove 10a is formed on the upper surface of the Si surface-mounting substrate 10 by etching and the ball lens 4 is positioned and fixed in the groove 10a as with this Embodiment 1, it is possible to surface mount with high precision within plus or minus 5 μm. Thereby, it is possible to locate a relative position of the laser diode 1 and the ball lens 4 with good accuracy remained.

A Si sub mounting substrate 10, to which the laser diode 1 and the ball lens 4 are thus attached, is joined to one face of the LD submount 11 and the LD submount 11 is mounted at the specified position on the stem in such a manner that the Si sub mounting substrate 10 is vertical to an upper surface of the stem 30.

Figure 3:
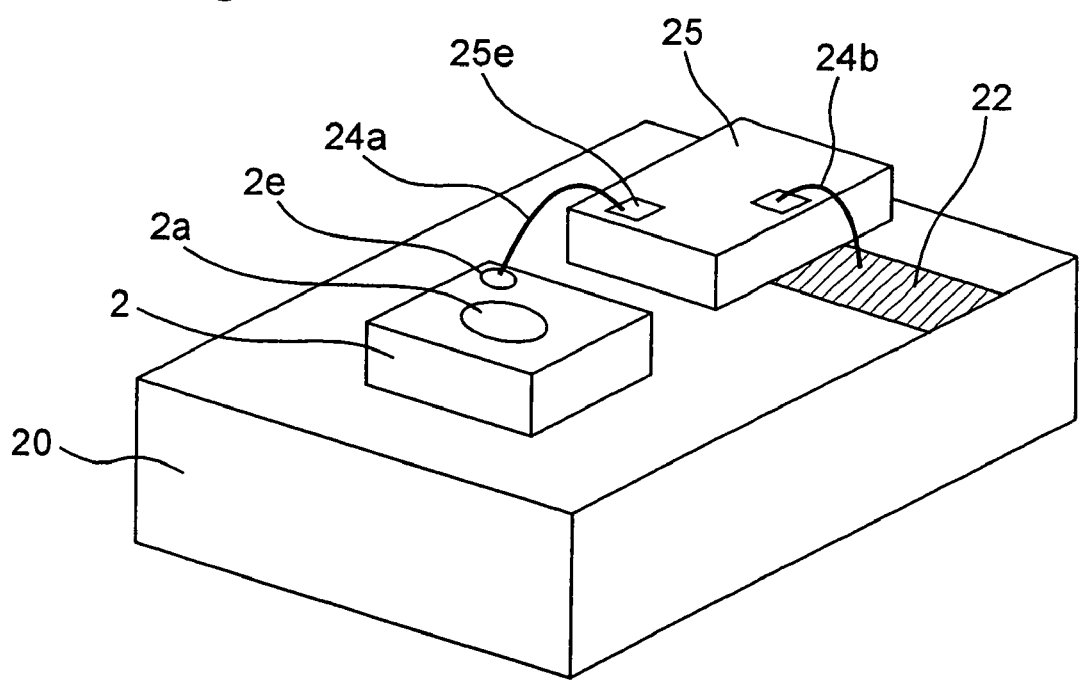
FIG. 3 is a perspective view of a photodiode (PD) surface mounted board provided a photodiode and an amplification IC.

In this Embodiment 1, the photodiode 2 is surface mounted on an upper surface of a photodiode (PD) surface mounted board 20 its light-receiving section 2a up (FIG. 3). And, as shown in FIG. 3, an amplification IC 25 for amplifying signals detected at the photodiode 2 is provided on the upper surface of the PD surface mounted board 20, and a wire 24a is connected between an electrode 25e of the IC and a PD electrode 2e of the photodiode 2 and a wire 24b is connected between the other electrode 25e of the amplification IC 25 and an electrode pattern 22 formed on an upper surface of the PD surface mounted board 20. This PD surface mounted board 20 can be fabricated from ceramic such as alumina.

Figure 4:
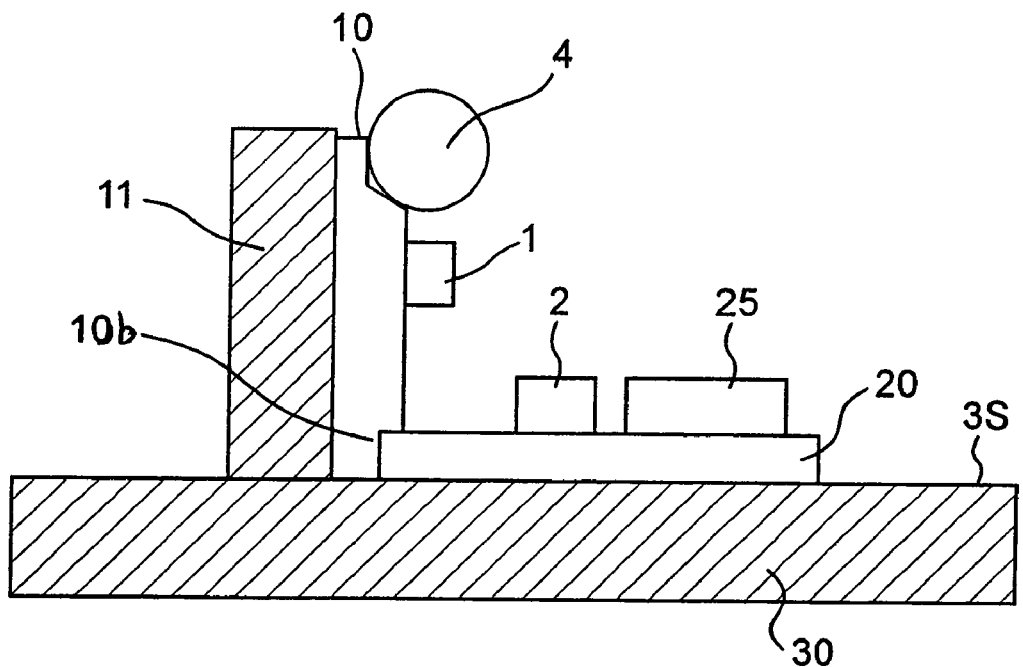
FIG. 4 is a perspective view showing a state in which a Si surface-mounting substrate and a photodiode (PD) surface mounted board are mounted on a stem.

The PD surface mounted board 20, on which the photodiode 2 and the amplification IC 25 are thus surface mounted, is secured at the specified position on an upper surface of the stem 30. Thus, the Si sub mounting substrate 10 and the PD surface mounted board 20 are provided so as to be orthogonal to each other, but in this Embodiment 1, a step 10b is formed along a side in an upper surface of the Si sub mounting substrate 10 and the PD surface mounted board 20 is arranged in such a way that a side thereof abuts on a bottom surface of the step 10b (FIG. 4). It is possible to secure accuracy of a relative position of the laser diode 1 and the photodiode 2 through this step 10b. Thus, a distance in the direction of an optical axis and a lateral distance of the laser diode 1 and the photodiode 2 can be stably secured.

And, a cap 40 covering the Si sub mounting substrate 10 and the PD surface mounted board 20 is provided on an upper surface of the stem 30. A window 40a, formed by attaching a glass plate 41 on an aperture of an upper surface, is formed on this cap 40 and the module is adapted to input and output light through the window 40a.

In this Embodiment 1, a lens 3, of which one surface is a lens surface 3a and the other surface is provided with a diffraction grating 5, is provided on the glass plate 41 of the cap 40 in such a manner that a diffraction grating surface S5 on which a diffraction grating 5 is formed is opposed to an upper surface of the glass plate 41. Incidentally, the lens 3 with which the diffraction grating 5 is integrated can be fabricated, for example, by etching of Si.

And, an optical fiber is provided at a predetermined distance from the lens surface 3a in such a way that the laser light of the laser diode is condensed onto an incident surface of the optical fiber 6 by the lens 3. Here, for example, the stem 30 is capped with a cylindrical adapter 50 and the optical fiber 6 inserted in a ferrule 7 is secured holder using the ferrule 7 and a ferrule holder Next, there will be described a structure of an optical system in the optical transmitter and receiver module of this Embodiment 1. In this optical transmitter and receiver module, the diffraction grating 5 is constructed with the diffraction grating integrated with the lens 3 as described above and constructed by forming a diffraction grating pattern on the surface opposite to the side of lens. Thus, in this Embodiment 1, the diffraction grating 5 and the lens 3 are combined into one and therefore the module can be constructed at low cost and easily.

Figure 5:
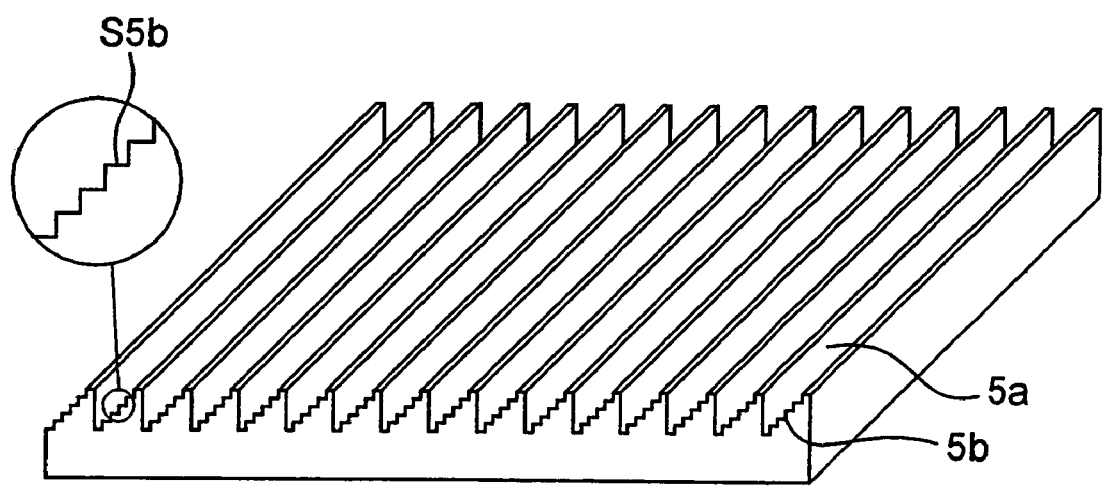
FIG. 5 is a perspective view showing a constitution of a diffraction grating of Embodiment 1.

An example of a configuration of the diffraction grating 5 is shown in FIG. 5. As shown in FIG. 5, this diffraction grating is composed of a plurality of cuneal (V-shaped in cross section) grooves having spacing, which are formed so as to be parallel with one another and straight. Each groove is composed of two planes forming a predetermined angle, and one of the two planes is substantially vertical (parallel to the direction of travel of the laser light) and the other is a sloped plane (plane intersecting diagonally with the direction of travel of the laser light). This sloped plane is further configured in the form of steps. In this Embodiment 1, with respect to the diffraction characteristic of the diffraction grating 5, a depth of the cuneal groove and number of steps are established in such a way that the diffraction grating passes (0th order diffraction) the first wavelength of the laser light emitted by the laser diode 1 without diffracting and diffracts the second wavelength of the light outgoing from the optical fiber.

Figure 6:
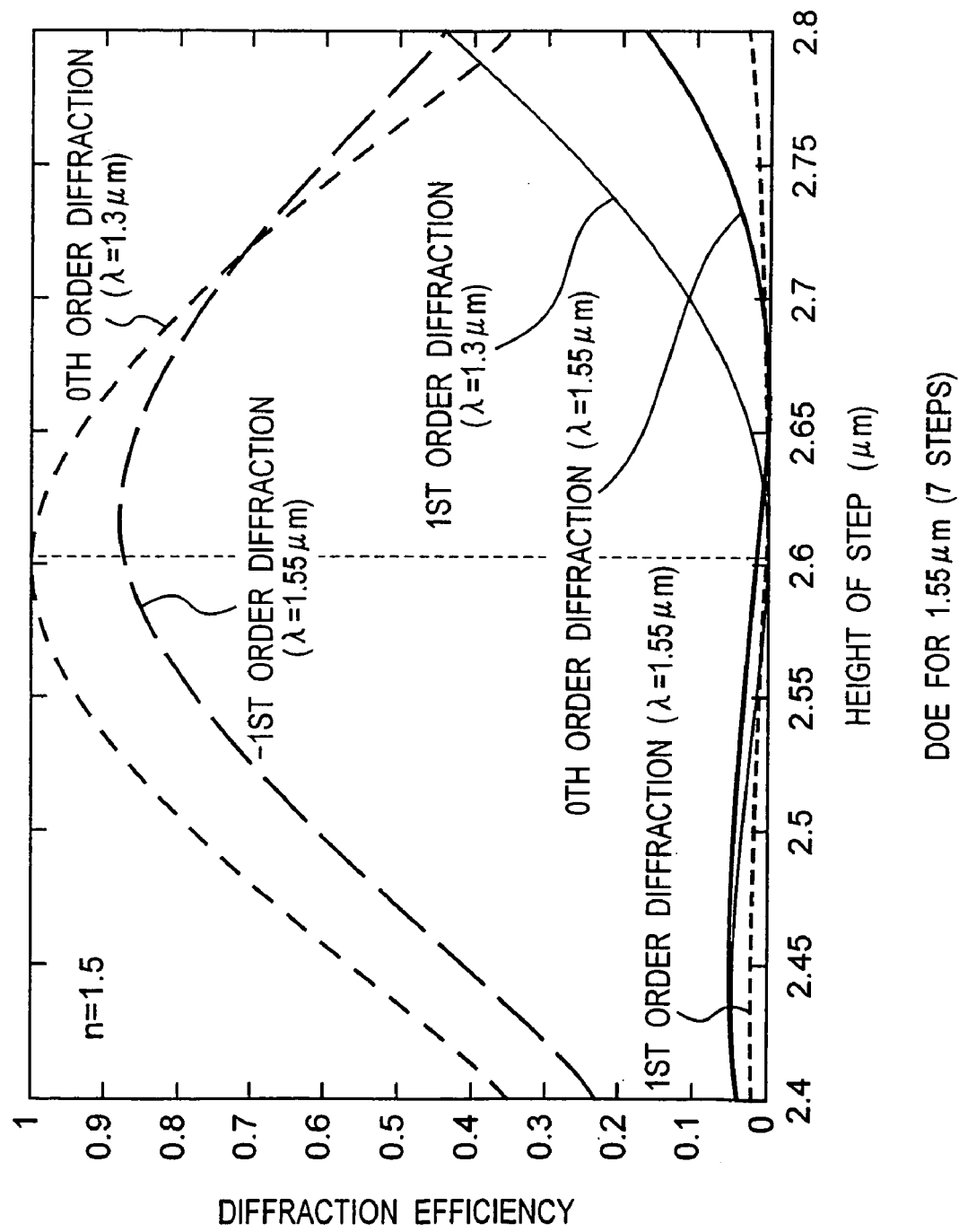
FIG. 6 is a graph showing diffraction efficiency characteristics of a diffraction grating of Embodiment 1.

As an example, in FIG. 6, there are shown diffraction efficiency characteristics (diffraction efficiency with respect to the depth of the groove) on lights with the wavelengths of 1.3 μm and 1.55 μm in the case where number of steps is 7. As is apparent from this FIG. 6, when a depth of the cuneal groove is set at 2.6 μm, almost all the light with the wavelength of 1.3 μm becomes 0th order diffraction, that is, pass through. On the other hand, about 90 percent of the light with the wavelength of 1.55 μm is diffracted at 1st order.

Figure 7:
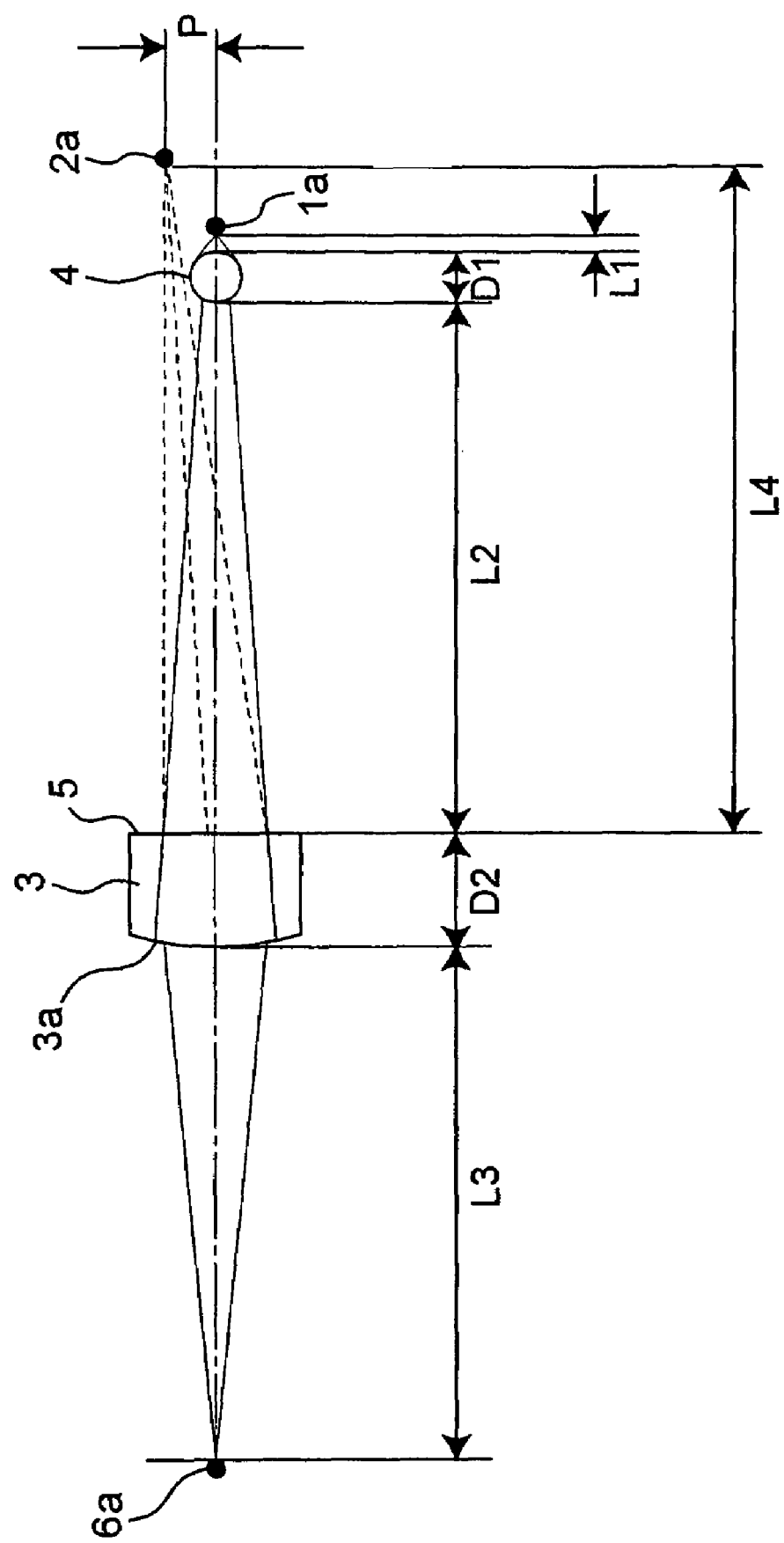
FIG. 7 is a view showing a constitution of an optical system of the optical transmitter and receiver module of Embodiment 1.
Figure 8A:
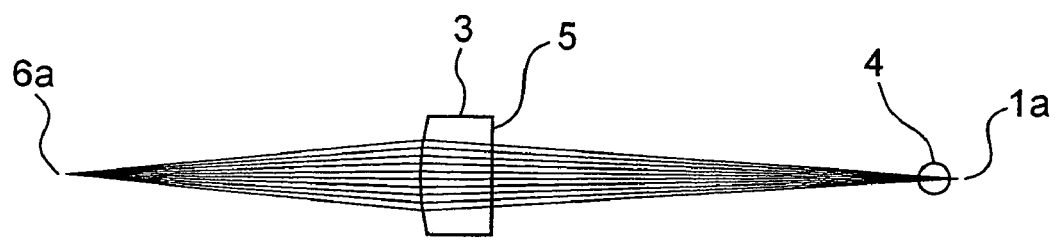
FIG. 8A is a view showing a path of a laser light outgoing from a laser diode in the optical transmitter and receiver module of Embodiment 1.
Figure 8B:
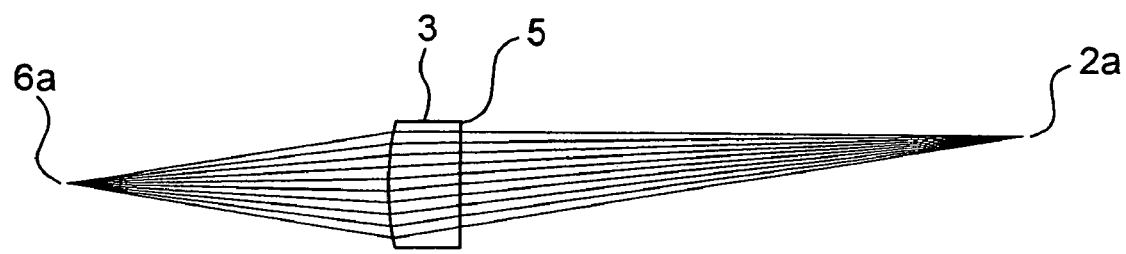
FIG. 8B is a view showing a path of light outgoing from an optical fiber in the optical transmitter and receiver module of Embodiment 1.

Therefore, an optical axis of the light with a wavelength of 1.55 μm, outgoing from the optical fiber 6, is separated from an optical axis of the laser light outgoing from the laser diode and entering the lens 3 through the ball lens 4 by passing through the above-mentioned diffraction grating. When the diffraction grating 5 thus constructed is present, the laser light with a wavelength of 1.3 μm, outgoing from the laser diode 1, passes through the diffraction grating 5 without diffracting after passing through the ball lens 4 and is condensed by the lens 3 to enter the optical fiber 6 (FIG. 7, FIG. 8A). And the light with a wavelength of 1.55 μm, outgoing from the optical fiber 6, is diffracted by passing through the diffraction grating 5 and enters the photodiode 2 without entering the ball lens 4 (FIG. 7, FIG. 8B).

Hereinafter, a more specific example concerning optical design in the optical transmitter and receiver module of Embodiment 1 will be shown in Table 1.

Here, symbols shown in Table 1 and FIG. 7 represent the following items.

L3: a distance between the optical fiber 6 and the lens 3

R2: the radius of the curvature of a lens surface of the lens 3

D2: a thickness of the lens 3

L2: a distance between the lens 4 and the lens 3

D1: a thickness of the lens 4 (equivalent to two times the radius of the curvature of a ball lens when a lens is a ball lens)

L1: a distance between the lens 4 and a light-emitting point 1a of the laser diode 1

L4: a distance between the lens 3 and a light-receiving point of the photodiode 2

P: a lateral spacing between the light-emitting point of the laser diode 1 and the light-receiving point of the photodiode 2

Here, in this example, as a material of the lens 3, silicon (Si, refractive index 3.45) is selected and as the lens 4, a ball lens made of glass having a refractive index of 1.5 was used. And, a pitch of the diffraction grating was 20 μm and in this diffraction grating, a diffraction angle was 4.3 degrees angle for light with a wavelength of 1.55 μm.

TABLE 1

| L3 mm | R2 mm | D2 mm | L2 mm | D1 mm | L1 mm | L4 mm | P mm |
|---|---|---|---|---|---|---|---|
| 2.7 | 4.3 | 0.65 | 3.6 | 0.3 | 0.03 | 4.78 | 0.36 |

Further, diagrams of rays of light in this time are shown in FIGS. 8A and 8B. FIG. 8A shows a diagram of rays of light from the laser diode to the optical fiber and FIG. 8B shows a diagram of rays of light from the optical fiber to the PD light-receiving section.

In the above example, when a spot size of the laser diode 1 is assumed to be about 1 μm and a spot size of the optical fiber 6 is assumed to be 4.5 μm, as a coupling efficiency in the case where a laser light of the laser diode 1 enters the optical fiber 6, a high coupling efficiency of about 60% can be attained.

The reason for attaining such a high coupling efficiency is that it is possible to allow the laser light outgoing from the laser diode 1 to enter the lens 3 with the laser light inhibited from diverging with the ball lens 4 and to allow the laser light to enter the optical fiber 6 by condensing it with the lens 3, and in addition to this it is possible to reduce the aberration of image formation by use of two lens.

That is, when respective parameters are set as shown in Table 1, a magnification $\beta 1$ (=f1/(f1−D1/2−L1)) of the spot size of the laser light at a diffraction grating surface by lens 4 is 5 times since a focal length f1 of the ball lens is 0.225 mm, and on the other hand, a magnification $\beta 2$ (=f2/(L4−f2)) at an incident face of the optical fiber 6 by lens 3 is 0.58 times since a focal length f2 of the lens 3 is 1.76 mm, and therefore an overall magnification becomes 2.9 times (5×0.58) and can be approached to optimum magnification of 4.5 times.

A spacing between the laser diode 1 and the photodiode 2 in the direction of an optical axis (L4−L2) can be 1.18 mm and a lateral spacing P can be 0.33 mm. These are sufficient spacing for easily surface mounting even when considering an overall size of the optical transmitter and receiver module. And, a ray bundle outgoing from the optical fiber 6 and reaching the light-receiving section does not cross the lens 4. The reason for this is that it is possible to make L4 larger than L3 by using a magnification of the lens 4 larger than the required overall magnification and a magnification of the lens 3 smaller than 1 and a distance between the diffraction grating and the light-receiving section becomes longer, and therefore the ray bundle can be largely separated with a relative small diffraction angle.

On the other hand, when the magnification of the lens 3 is 0.1 or less, a distance L4 between the lens 3 and a light-receiving point of the photodiode 2 becomes 27 mm, the overall size of module becomes large and therefore the magnification of the lens 3 is preferably set at 0.1 or more and 1.0 or less. Further, by using a magnification of the lens 3 of 1 or less, it is possible to lengthen a distance between the lens 3 and the light-receiving section and to increase the separation of optical axes through diffraction.

Furthermore, the overall magnification is desirably 2 or more, and therefore the magnification of the lens 3 is more desirably 0.4 or more. And, since when a lateral spacing P between the light-emitting point of the laser diode 1 and the light-receiving point of the photodiode 2 is 0.25 mm or less, it becomes difficult to surface mount the light-emitting point of the laser diode 1 and the photodiode 2, L4 is desirably set at 3.4 mm or less and to do so, the magnification of the lens 3 is desirably 0.8 or less. That is, the magnification of the lens 3 is more desirably set at 0.4 or more and 0.8 or less.

In this example, there was used a ball lens with a diameter of 0.3 mm and a refractive index of 1.5 as the ball lens 4, but a substantially same effect can be obtained also when for example, a ball lens with a diameter of 0.5 mm and a refractive index of 1.8 (focal length f1=0.28 mm) or a ball lens with a diameter of 0.8 mm and a refractive index of 2.0 (focal length f1=0.2 mm).

Thus, as a second lens, ball lenses of various sizes can be used in the present invention, but when considering that it becomes difficult to surface mount in a ball lens having a diameter of 0.1 mm or less, a ball lens preferably has a diameter of at least 0.1 mm and at most 0.8 mm, and further when a readily available material is selected as a lens material, a ball lens more preferably has a diameter of at least 0.3 mm and at most 0.5 mm, considering the refractive index of the material. Further, when a ball lens 4 having a diameter of at most 0.8 mm is adopted, the module can be easily designed in such a way that the first lens does not to interrupt a ray bundle outgoing from the optical fiber and reaching the light-receiving section.

And, in the optical transmitter and receiver module of Embodiment 1 in accordance with the present invention, the diffraction grating 5 is adapted to diffract the light outgoing from the optical fiber by a diffraction effect, and to perform 0th order diffraction and not to exert a diffraction effect on the laser light.

Therefore, since it can condense and diffract the light with one wavelength without exerting an effect on the light with the other wavelength, flexibility of optical design increases and the coupling efficiency for the optical fiber can be enhanced.

Embodiment 2

Figure 9:
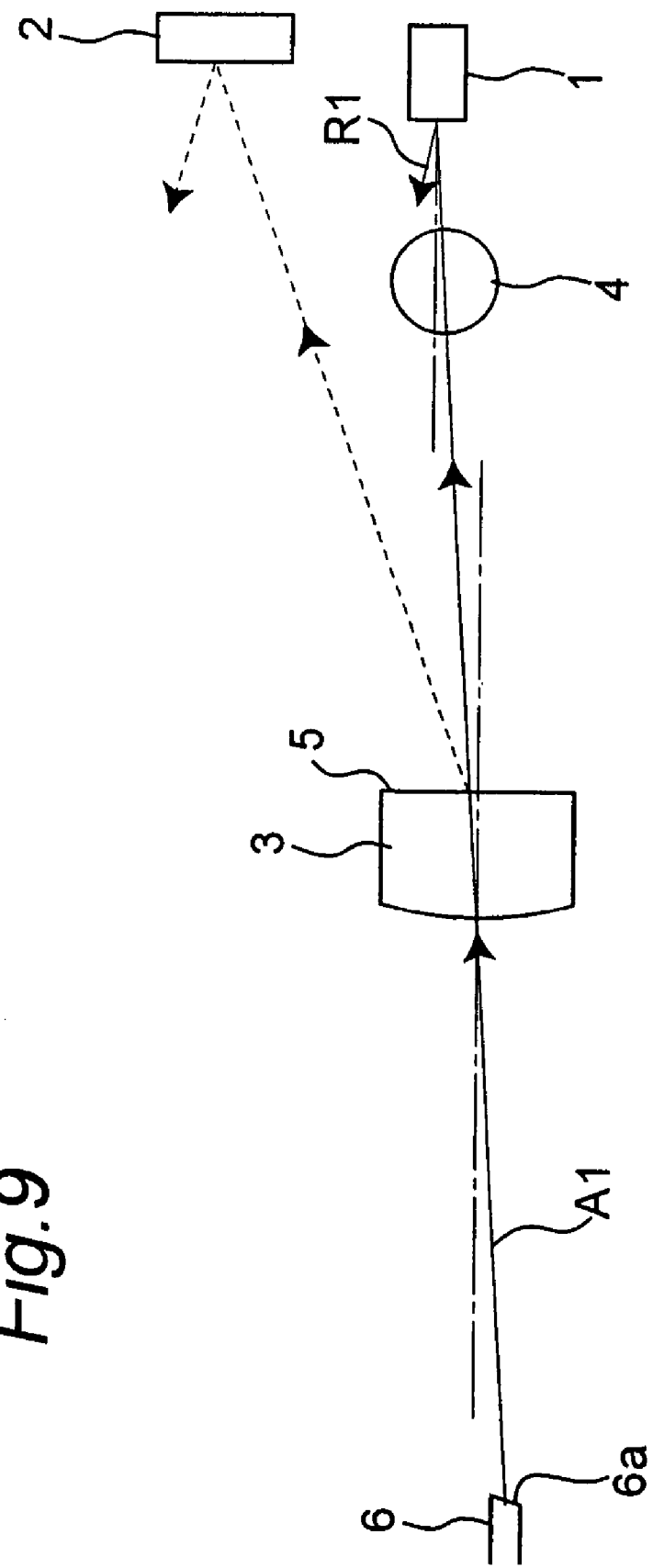
FIG. 9 is a view showing a constitution of an optical system of the optical transmitter and receiver module of Embodiment 2 in accordance with the present invention.

An optical transmitter and receiver module of Embodiment 2 in accordance with the present invention is one adapted so as to prevent a reflected light generated by reflection of the light outgoing from an optical fiber 6 on an end surface of the laser diode from returning to the optical fiber 6 in the optical transmitter and receiver module of Embodiment 1. In FIG. 9, there is shown a constitution of a lens system of this Embodiment 2.

That is, in this Embodiment 2, a center of a lens 3 is positioned on an optical axis of an optical system, which passes through a center of a light input/output face of the optical fiber 6 and a light-emitting point of the laser diode 1 and a ball lens 4 is decentered with respect to the optical axis of the optical system.

In other words, the lens 3 is decentered with respect to a straight line passing through a center of the ball lens 4 and the light-emitting point of the laser diode 1 (a straight line including the light-emitting point and being orthogonal to a light-emitting face of the laser diode).

And, in this Embodiment 2, the light input/output face of the tip of the optical fiber 6 is not orthogonal to the optical axis of the optical system and is tilted by 8-degree angle with respect to a plane orthogonal to the optical axis of the optical system.

In the optical transmitter and receiver module of Embodiment 2 thus constructed, since the light input/output face of the optical fiber 6 is not orthogonal to the optical axis of the optical system, the laser light outgoing from the laser diode 1 does not enter the laser diode 1 again even if it is reflected on the light input/output face, and since a light-emitting face of the laser diode 1 is not orthogonal to the optical axis of the optical system, the light outgoing from the optical fiber 6 does not enter the optical fiber 6 again even if it is reflected on the light-emitting face of the laser.

In addition, in Embodiment 2, an amount of decentering of a ball lens 4 with respect to the optical axis of the optical system can be easily secured by adjusting a width of a groove or the like in Si surface-mounting substrate.

What is claimed is:

1. An optical transmitter and receiver module connected to an optical fiber, which transmits a first light and receives a second light via said optical fiber, said module comprising:
   a light source emitting said first light;
   a light-receiving section receiving said second light;
   a diffraction device through which both the first light and the second light are transmitted, the diffraction device changing the direction of travel of at least one of said first light and said second light so that an optical axis of said first light and an optical axis of said second light are separated;
   a first lens which condenses said first light, outgoing from said light source and entering through the medium of said diffraction device, onto a light input/output face of said optical fiber and condenses said second light outgoing from said optical fiber onto said light-receiving section through the medium of said diffraction device; and
   a second lens which inhibits a beam of said first light outgoing from said light source from diverging and allows it to enter said first lens through the medium of said diffraction device,
   wherein said second light is received by said light-receiving section without transmitting said second lens.

2. The optical transmitter and receiver module according to claim 1, wherein said first lens has opposite two surfaces, and one surface thereof is a curved surface for condensing a light beam and the other surface is provided with a diffraction grating, of which said diffraction device is constructed.

3. The optical transmitter and receiver module according to claim 2, wherein said diffraction grating diffracts one light of said first light and said second light and allows the other light go straight.

4. The optical transmitter and receiver module according to claim 3, wherein said first lens condenses said first light entering said first lens onto said light input/output face with a spot size of said first light changed to at least 0.1 times and at most 1.0 times a spot size in entering.

5. The optical transmitter and receiver module according to claim 2, wherein said first lens condenses said first light entering said first lens onto said light input/output face with a spot size of said first light changed to at least 0.1 times and at most 1.0 times a spot size in entering.

6. The optical transmitter and receiver module according to claim 1, wherein said diffraction grating diffracts one light of said first light and said second light and allows the other light go straight.

7. The optical transmitter and receiver module according to claim 6, wherein said first lens condenses said first light entering said first lens onto said light input/output face with a spot size of said first light changed to at least 0.1 times and at most 1.0 times a spot size in entering.

8. The optical transmitter and receiver module according to claim 1, wherein said first lens condenses said first light entering said first lens onto said light input/output face with a spot size of said first light changed to at least 0.1 times and at most 1.0 times a spot size in entering.

9. The optical transmitter and receiver module according to claim 1, wherein said second lens is a ball lens having a diameter of at least 0.1 mm and at most 0.8 mm.

10. The optical transmitter and receiver module according to claim 9, wherein said module includes a light source surface mounted substrate on which said light source is surface mounted and said ball lens is surface mounted in a lens surface mounted groove formed in the light source surface mounted substrate.

11. The optical transmitter and receiver module according to claim 10, wherein said module includes a light-receiving section board provided with said light-receiving section and said light-receiving section board is positioned by abutting a side thereof on a positioning groove formed along a side in a mounting surface of said light source surface mounted substrate.

12. The optical transmitter and receiver module according to claim 1, wherein said second lens is decentered with respect to a straight line passing through a light-emitting point of said light source and said first lens.

* * * * *

UNITED STATES PATENT AND TRADEMARK OFFICE
CERTIFICATE OF CORRECTION

PATENT NO.         : 7,128,477 B2                                         Page 1 of 1
APPLICATION NO.    : 11/106501
DATED              : October 31, 2006
INVENTOR(S)        : Seiichiro Tabata et al.

It is certified that error appears in the above-identified patent and that said Letters Patent is hereby corrected as shown below:

On the title page:

Under item "(73) Assignees:", change " Renesas Technology Corp., Tokyo (JP); Oki Electric Industry Co., Ltd., Tokyo (JP) " to -- Mitsubishi Denki Kabushiki Kaisha, Tokyo (JP); Oki Electric Industry Co., Ltd., Tokyo (JP) --

Signed and Sealed this

Thirtieth Day of October, 2007

JON W. DUDAS
*Director of the United States Patent and Trademark Office*